(12) United States Patent
Lee

(10) Patent No.: US 9,094,008 B2
(45) Date of Patent: Jul. 28, 2015

(54) HIGH VOLTAGE SWITCH IN LOW VOLTAGE PROCESS

(75) Inventor: Edward K. F. Lee, Fullerton, CA (US)

(73) Assignee: Alfred E. Mann Foundation For Scientific Research, Santa Clarita, CA (US)

( * ) Notice: Subject to any disclaimer, the term of this patent is extended or adjusted under 35 U.S.C. 154(b) by 0 days.

(21) Appl. No.: 12/869,426

(22) Filed: Aug. 26, 2010

(65) Prior Publication Data

US 2011/0050321 A1    Mar. 3, 2011

Related U.S. Application Data

(60) Provisional application No. 61/237,233, filed on Aug. 26, 2009.

(51) Int. Cl.
| H03K 17/00 | (2006.01) |
| H03K 17/10 | (2006.01) |
| H03K 17/12 | (2006.01) |
| H03K 17/687 | (2006.01) |

(52) U.S. Cl.
CPC ........... *H03K 17/102* (2013.01); *H03K 17/122* (2013.01); *H03K 17/6872* (2013.01)

(58) Field of Classification Search
CPC ..... H03K 17/00; H03K 17/04; H03K 17/102; H03K 17/122; H03K 17/682
USPC .................. 327/374, 472, 365, 376, 377, 427
See application file for complete search history.

(56) References Cited

U.S. PATENT DOCUMENTS

| 5,465,054 | A | 11/1995 | Erhart | |
| 5,504,444 | A | 4/1996 | Neugebauer | |
| 5,696,459 | A | 12/1997 | Neugebauer | |
| 5,729,155 | A | 3/1998 | Kobatake | |
| 5,818,257 | A | 10/1998 | Villa | |
| 5,834,948 | A | 11/1998 | Yoshizaki | |
| 6,064,227 | A | 5/2000 | Saito | |
| 6,492,860 | B1 * | 12/2002 | Ramakrishnan | 327/404 |
| 6,518,818 | B1 | 2/2003 | Hynes | |
| 6,605,977 | B2 * | 8/2003 | Martini | 327/427 |
| 6,804,502 | B2 | 10/2004 | Burgener | |
| 6,911,860 | B1 | 6/2005 | Wang | |
| 7,123,898 | B2 | 10/2006 | Burgener | |
| 7,400,171 | B1 | 7/2008 | Montazer | |
| 7,649,384 | B2 | 1/2010 | Ho | |
| 7,724,069 | B1 * | 5/2010 | Webb | 327/534 |
| 8,098,088 | B1 * | 1/2012 | Sutandi et al. | 327/427 |
| 2007/0177323 | A1 | 8/2007 | Sneep | |

OTHER PUBLICATIONS

European Patent Office, Extended Search Report dated Nov. 25, 2011 for European Patent Application 10174219.5, Title: High Voltage Switch in Low Voltage Process, Inventor: Edward K. F. Lee, Filed: Aug. 26, 2010.

* cited by examiner

*Primary Examiner* — Hai L Nguyen
(74) *Attorney, Agent, or Firm* — Oleh J. Zajac

(57) ABSTRACT

A high voltage analog switch operable by a binary signal is implemented in a low voltage semiconductor process. The switch has three parallel circuit paths, with each path comprising at least three series connected transistors. Control signals are selectively applied to the control terminals of the transistors to control the switch and selectively turn on or turn off each of the three circuit paths depending on the input voltage range, so that the breakdown voltage of all of the transistors is never exceeded in any mode of operation.

11 Claims, 4 Drawing Sheets

| Binary Signal S | Control Lines | | | |
| --- | --- | --- | --- | --- |
|  | C | Cb | U | Ub |
| 0 (Switch = off) | Gnd | Vdd | Vdd | 2 x Vdd |
| 1 (Switch = on) | Vdd | Gnd | 2 x Vdd | Vdd |

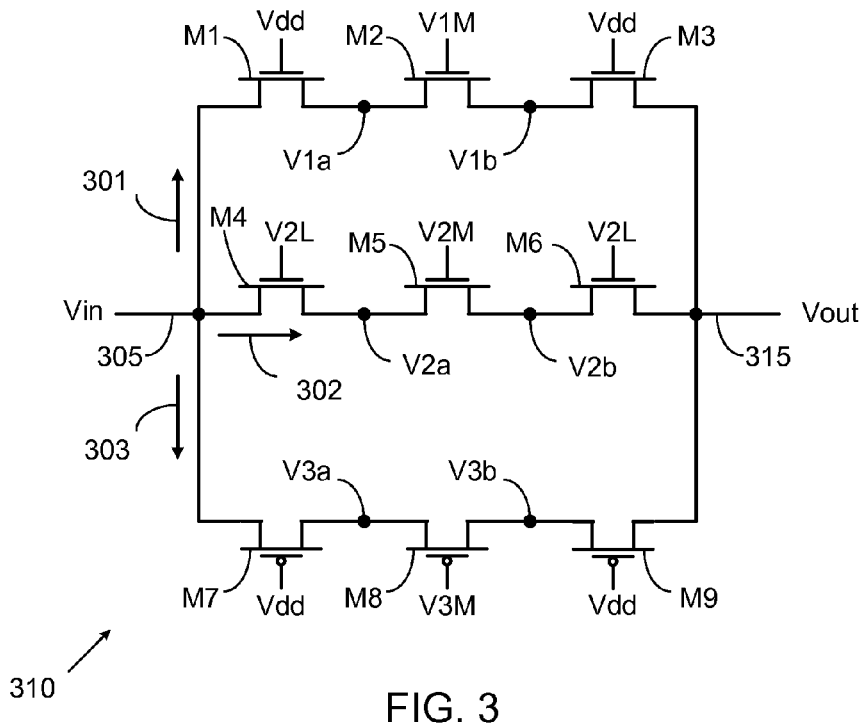

FIG. 3

| Input State S | Input Voltage Range | First Circuit Path 301 | | | Second Circuit Path 302 | | | Third Circuit Path 303 | | |
|---|---|---|---|---|---|---|---|---|---|---|
| | | M1 | M2 | M3 | M4 | M5 | M6 | M7 | M8 | M9 |
| | | | | | | | | | | |
| ON | Low | on | on | on | on | on | on | off | off | off |
| | Middle | off | off | off | on | on | on | off | off | off |
| | High | off | off | off | off | off | off | on | on | on |
| | | | | | | | | | | |
| OFF | Low | on | off | on | on | off | on | off | off | off |
| | Middle | off | off | off | off | off | off | off | off | off |
| | High | off | off | off | off | off | off | on | off | on |

Where Input Voltage Ranges are:

Low, when $0 < V_{in} < V_{dd} - V_t$

Middle, when $V_{dd} - V_t < V_{in} < V_{dd} + V_t$

High, when $V_{dd} + V_t < V_{in} < 2 \times V_{dd}$

FIG. 4

| Input State S | Input Voltage Range (Vin) | Gate Voltages | | | |
|---|---|---|---|---|---|
| | | V1M (M2) | V2L (M4, M6) | V2M (M5) | V3M (M8) |
| ON | Low | Vdd | ~ Vdd | ~ Vdd | Vdd |
| | Middle | Vdd | Vin + Voffset | Vin + Voffset | Vdd |
| | High | Vdd | Vin + Voffset < 2 x Vdd | Vin + Voffset < 2 x Vdd | Vdd |
| OFF | Any | 0 | Vdd | 0 | 2 x Vdd |

Where Input Voltage (Vin) Ranges are:

Low, when  0 < Vin < Vdd − Vt

Middle, when  Vdd − Vt < Vin < Vdd + Vt

High, when  Vdd + Vt < Vin < 2 x Vdd; and

Vdd = first supply voltage, 2 x Vdd = second supply voltage,

Vt = typical threshold voltage of transistors M1-M9 and Voffset > Vt.

FIG. 5

| Input State S | Voltage Range | Node Voltages | | |
|---|---|---|---|---|
| | | V1a or V1b | V2a or V2b | V3a or V3b |
| ON | Low | Vin | Vin | Vdd + Vt |
| | Middle | Vdd − Vt | Vin | Vdd + Vt |
| | High | Vdd − Vt | < 2 x Vdd − Vt | Vin |
| OFF | Low | Vin or Vout | Vin or Vout | Vdd + Vt |
| | Middle | Vdd − Vt | Vdd − Vt | Vdd + Vt |
| | High | Vdd − Vt | Vdd − Vt | Vin or Vout |

Where Voltage Range can be Input or Output Range and Input and Output Ranges are Independent:

Low, when  0 < Vin < Vdd − Vt

Middle, when  Vdd − Vt < Vin < Vdd + Vt

High, when  Vdd + Vt < Vin < 2 x Vdd

HIGH VOLTAGE SWITCH IN LOW VOLTAGE PROCESS

CROSS REFERENCE TO RELATED APPLICATIONS

This application claims the benefit under 35 USC 119(e) of provisional patent application No. 61/237,233, which was filed on Aug. 26, 2009, and which is hereby incorporated by reference.

FIELD OF THE INVENTION

The invention relates to semiconductor circuits, and more specifically to a high voltage switch implemented in a low voltage semiconductor process.

BACKGROUND OF THE INVENTION

Advanced integrated circuit fabrication processes, such as CMOS can produce chips with low power consumption, high logic density and high speed of operation. However, these modern processes manufacture integrated circuits that operate at low voltages, due to the lowered breakdown voltages of the transistors that are fabricated. These low voltage IC's are difficult to interface with circuits operating at higher voltage levels, unless special processes are used that can produce low voltage and high voltage devices in the same IC, but these special processes can have disadvantages such as limited performance capabilities.

One particular area of technology using low voltage ICs, but required to interface to higher voltage circuits is implantable medical devices for the purpose of functional electrical stimulation (FES). Such devises stimulate nerve bundles with electrodes in close proximity to the nerve tissue. The ability to process high voltage signals using high voltage tolerant circuits such as analog switches, with integrated circuits built using low voltage advanced CMOS processes, is highly desirable.

SUMMARY OF THE INVENTION

A high voltage analog switch operable by a binary signal is implemented in a low voltage semiconductor process. The binary signal is converted to control signals with fixed voltage levels: ground and supply voltages Vdd and 2×Vdd. An additional control voltage is used which is equal to the switch input voltage level plus an added offset voltage. The switch has three parallel circuit paths, with each path comprising at least three series connected MOSFET transistors. The control signals are selectively applied to the gates of the transistors to control the switch and selectively turn on or turn off each of the three circuit paths depending on the input voltage range, so that the breakdown voltage of any of the transistors is never exceeded in any mode of operation.

BRIEF DESCRIPTION OF THE DRAWINGS

FIG. 3 shows a circuit diagram of an exemplary switch module for the high voltage switch of FIG. 1.

FIG. 4 shows a table of on/off states for the transistors of the switch module of FIG. 3.

FIG. 5 shows a table of gate voltages for the switched transistors of the switch module of FIG. 3.

FIG. 6 shows a table of node voltages within the switch module of FIG. 3.

DETAILED DESCRIPTION

Figures 1, 2:
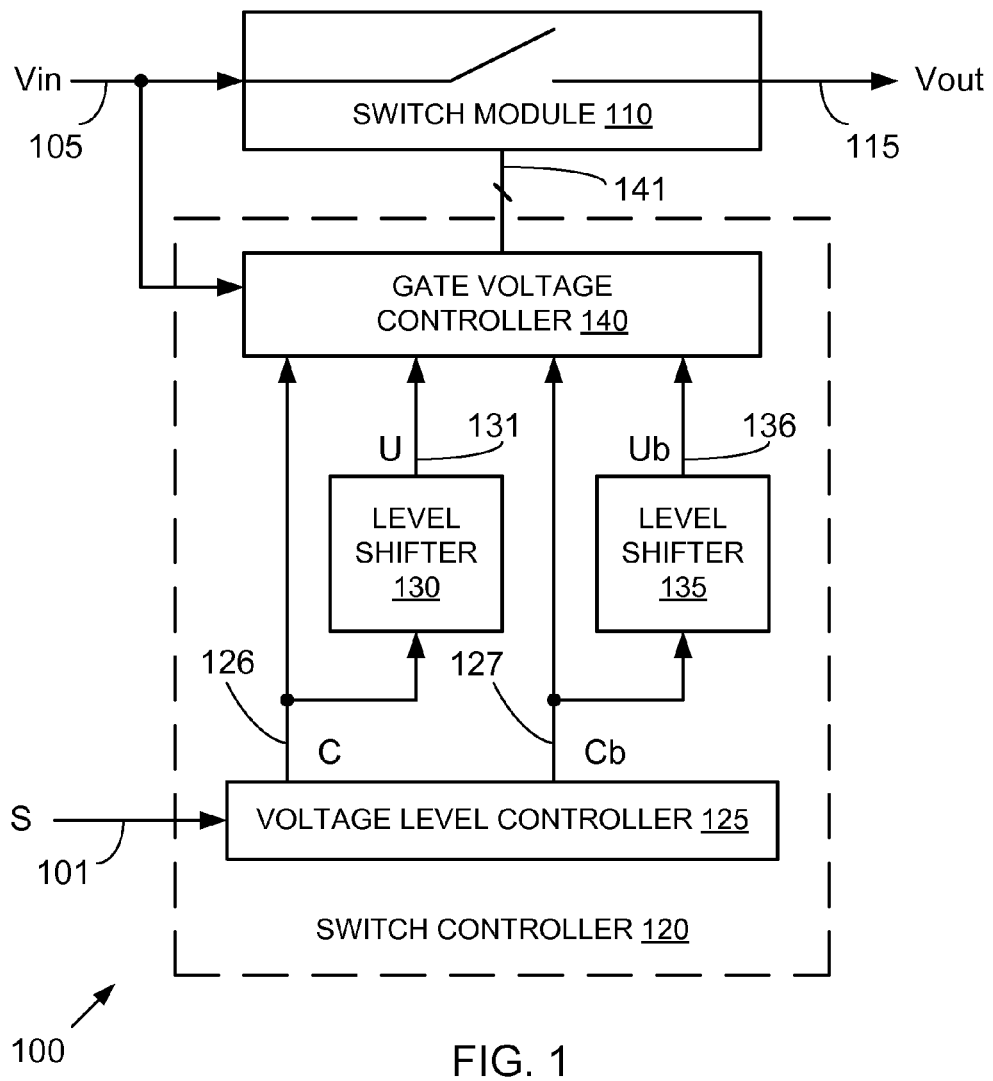
FIG. 1 shows a block diagram of a high voltage switch according to an embodiment of the present invention.
FIG. 2 shows an exemplary table of relative voltage levels generated within a switch controller for the high voltage switch of FIG. 1.

FIG. 1 shows a block diagram of a high voltage analog switch (HVS) 100 according to an embodiment of the present invention. An input voltage Vin is coupled to a first terminal 105 of switch 100 which is coupled to the input of switch module 110. Terminal 115 is the output terminal of switch 100. Input line 101 couples binary signal S to switch 100 and controls the operation of switch 100. When S=a binary "1" or high, then switch 100 is ON and Vin is connected to Vout. When S="0" or low, then switch 100 is OFF and Vin is disconnected from Vout.

Switch module 110 is controlled by switch controller 120, which receives binary signal S. Switch controller 110 includes voltage level controller 125, level shifters 130 and 135 and gate voltage controller 140. Input line 101 couples signal S to voltage level controller 120, which generates control signals C and Cb. Cb is the logical complement of C. Control signals C and Cb are coupled to respective level shifters 130 and 135, which generate respective control signals U and Ub. Ub is the logical complement of U. Input voltage Vin and control signals C, Cb, U and Ub are coupled to gate voltage controller 140, which generates the gate control voltages needed to control the operation of switch module 110 by way of multiple control lines 141. When a gate voltage follows the input voltage Vin, the voltage applied to the gate is equal to the input voltage and a small offset voltage Voffset, in which case the gate control voltage=Vin+Voffset. Switch 100 receives a first supply voltage Vdd and a second supply voltage=2×Vdd, which are not shown in FIG. 1.

Switch 100 can be implemented in a low voltage CMOS process forming MOSFET transistors with a breakdown voltage of, for example 3.3 volts, operating with a typical first supply voltage Vdd=3.0 volts and a typical second supply voltage 2×Vdd, but with the capability of switching an input voltage Vin of approximately 6 volts (or approximately 2×Vdd) without exceeding the breakdown voltage of any of the MOSFET transistors in switch 100.

Switch 100 is a floating switch in that when switch 100 is in the off state, the input voltage Vin and the output voltage Vout can be at any voltage potential.

FIG. 2 shows an exemplary table of relative voltage levels for control lines C, Cb, U and Ub within switch controller 120 for the switch of FIG. 1. Switch controller 120 converts binary signal S to control signals with three voltage levels: ground and supply voltages Vdd and 2×Vdd. Switch 100 is in the OFF state, if C=Gnd, Cb=Vdd, U=Vdd and Ub=2×Vdd. Switch 100 is in the ON state, if C=Vdd, Cb=Gnd, U=2×Vdd and Ub=Vdd.

FIG. 3 shows a circuit diagram of an exemplary switch module 310 for the high voltage switch of FIG. 1. Switch module 310 includes three parallel circuit paths (301, 302 and 303), where each path is made of three series connected MOSFET transistors. The bulk terminal of each transistor is usually connected to the source terminal of the corresponding transistor. The breakdown voltage limit across any terminals to the bulk terminal of each individual transistor is not a concern throughout the discussion below. Circuit path 301 includes transistors M1, M2 and M3 of a first polarity controlled by respective gate control voltages: Vdd, V1M and Vdd and with node voltages V1a and V1b between the transistors. Circuit path 302 includes transistors M4, M5 and M6 of a first polarity controlled by respective gate control voltages: V2L, V2M and V2L and with node voltages V2a and V2b between the transistors. The voltage levels for V2L, V2M and V2L are not limited to the three voltage levels previously mentioned: Gnd, Vdd and 2×Vdd. These voltages also depend on the input voltage Vin in some modes of operation, as will be described with respect to FIG. 5. Circuit path 303 includes transistors M7, M8 and M9 of a second polarity controlled by respective gate control voltages: Vdd, V3M and Vdd and with node voltages V3a and V3b between the transistors.

The first (M1, M4, M7) and the third (M3, M6, M9) transistors in each of the three circuit paths are voltage range limiting transistors, which limit the voltage across the middle transistors (M2, M5, M8) and prevent the voltages across all of the transistors from exceeding their breakdown voltages.

FIG. 4 shows the on/off state of each of the transistors in the three circuit paths as switched on or off by gate voltage controller 140 in accordance with the input voltage range. When switch 100 is in the ON state, the ON state resistance of the switch is assumed to be significantly lower than the load resistance connected to the output of switch 100 such that the output voltage Vout at terminal 115 can be considered to be equal to the input voltage Vin at terminal 105.

When switch 100 is in the ON state, and the input voltage is in the low range of: 0<Vin<Vdd−Vt, where Vt is the typical threshold voltage of a MOSFET transistor, then the first circuit path 301 transistors M1, M2 and M3 are turned on by gate voltage controller 140.

When switch 100 is in the ON state, and the input voltage is in the middle range of: Vdd−Vt<Vin<Vdd+Vt, then the second circuit path transistors M4, M5 and M6 are turned on by gate voltage controller 140. Since transistors M4, M5 and M6 in the second circuit path 302 have the same polarity as transistors M1, M2 and M3 in the first circuit path 301, transistors M4, M5 and M6 are also turned on by gate voltage controller 140, when Vin is in the middle voltage range.

When switch 100 is in the ON state, and the input voltage is in the high range of: Vdd+Vt<Vin<2×Vdd, then only the third circuit path 303 transistors M7, M8 and M9 are turned on by gate voltage controller 140.

When switch 100 is in the OFF state, and the input voltage is in the low range of: 0<Vin<Vdd−Vt, then only the first circuit path 301 transistors M1 and M3 are turned on by gate voltage controller 140.

When switch 100 is in the OFF state, and the input voltage is in the middle range of: Vdd−Vt<Vin<Vdd+Vt, then only the first circuit path transistors M1 and M3 are turned on by gate voltage controller 140.

When switch 100 is in the OFF state, and the input voltage is in the high range of: Vdd+Vt<Vin<2×Vdd, then only the third circuit path 303 transistors M7 and M9 are turned on by gate voltage controller 140. Since the middle transistors (M2, M5 and M8) of all three paths (301, 302 and 303) are turned off when switch 100 is in the OFF state, there will be no current flow between the input voltage Vin at terminal 105 and the output voltage Vout at terminal 115.

The turning on and off of the various circuit paths overlap for different input voltage ranges to some extent since the transistors are not completely turned on or off as the input voltage Vin varies from one range to another range and there may still be some conduction of current within the transistors, except for transistors M2, M5 and M8 in the OFF state. Switch 100 uses three circuit paths operating at three different (but with some overlap) voltage ranges in order to provide a relatively undistorted connection in the on state between Vin and Vout across the input voltage range of Vin.

FIG. 3 shows that the gate voltages connected to transistors M1 and M3 in the first circuit path 301 and transistors M7 and M9 in the third circuit path 303 in all states of operation are set to the first supply voltage Vdd. The table in FIG. 5 shows the gate voltages applied to the other transistors (M2, M4, M5, M6 and M8) in switch module 310 as a function of the state of switch 100 and the range of the input voltage Vin. For transistors M4, M5 and M6 in the second circuit path 302, when the input voltage Vin is in the middle or high range, the gate voltages of these transistors follow the input voltage, plus an offset voltage Voffset. The offset voltage Voffset is slightly greater than Vt such that the gate voltages of transistors M4, M5 and M6 are always higher than the input voltage Vin by Vt to keep transistors M4, M5 and M6 on. The gate voltages of the other transistors in the table in FIG. 5, are set to 2×Vdd, Vdd or 0V, when switch 100 is in the OFF state.

When switch 100 is in the OFF state and no current flow is allowed in all three paths, then the gate voltages for M2 and M5 are at zero volts, and the gate voltage for transistor M8 is set to 2×Vdd. The gate voltages for transistors M1, M3, M4, M6, M7 and M9 are set to Vdd for limiting the source voltages and the drain voltages of transistors M2, M5 and M8 are within one Vdd. The source voltages and the drain voltages for transistors M1, M3, M4, M6, M7 and M9 are also limited to within one Vdd for the input voltage at terminal 105 and the output voltage at terminal 115 varying within the voltage range between 0V and 2×Vdd.

FIG. 6 shows a table of node voltages for the switch module of FIG. 3. Based on the node voltages for different input and output voltage ranges in the ON and OFF states, it can be observed that the voltages across the different terminals of all the transistors are less than the breakdown voltage of any of the transistors in switch 100.

Figure 7:
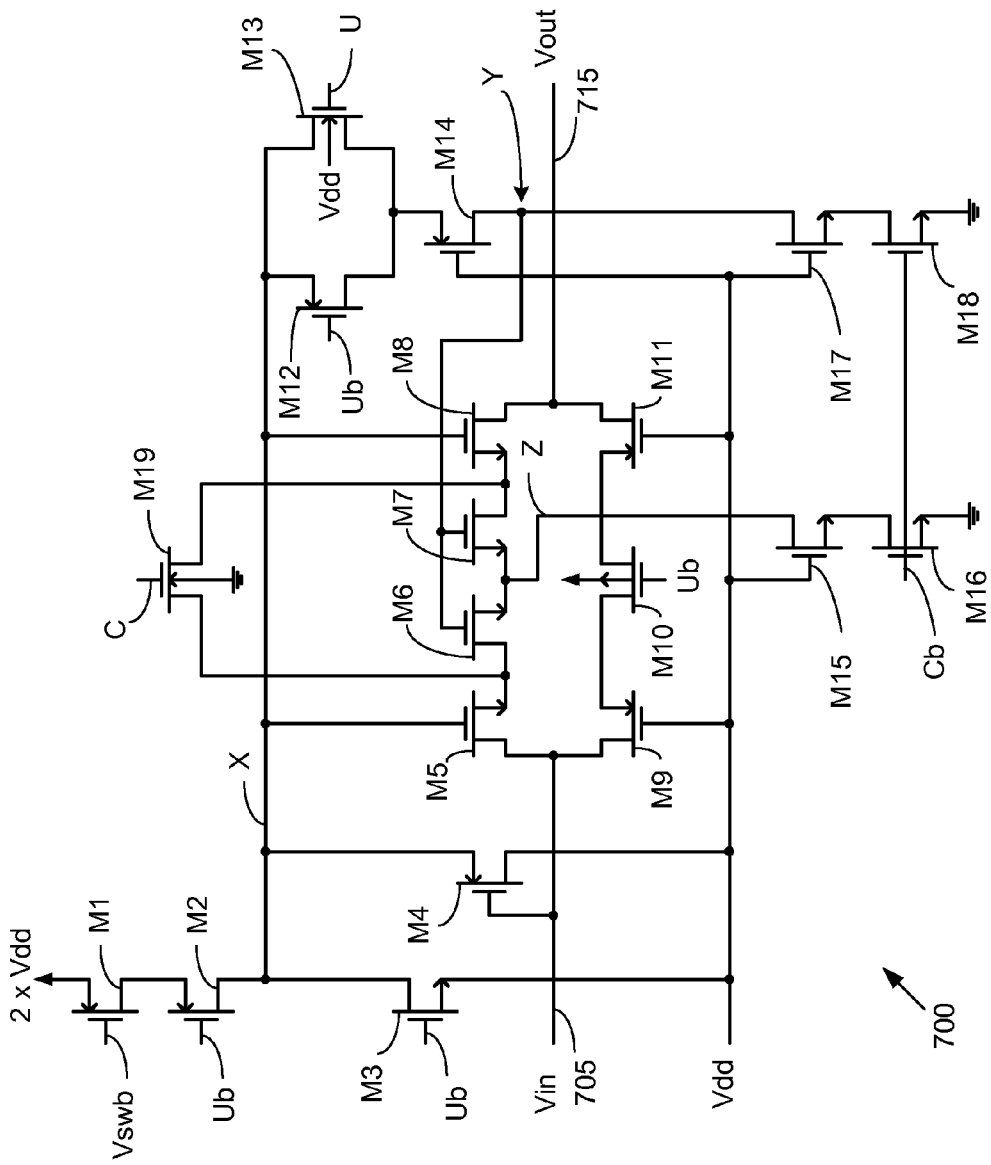
FIG. 7 shows a circuit diagram for an alternate embodiment of the high voltage switch of the present invention.

FIG. 7 shows a circuit diagram for an alternate embodiment of the high voltage switch 700 of the present invention. For purposes of simplifying the diagram, electronic circuits equivalent to the level shifters 130 and 135 of FIG. 1 are not shown in FIG. 7. An equivalent to the gate voltage controller 140 of FIG. 1 is part of the circuit of FIG. 7. Control signals C, Cb, U and Ub, discussed previously, are shown connected to switch 700 to the gates of various transistors of switch 700. The third path 303 in FIG. 3 is equivalent to transistors M9, M10 and M11 in FIG. 7. Since the first path 301 and the second path 302 in FIG. 3 have transistors with the same polarity, some transistors in the two paths can be combined together if proper gate voltage controls are applied. Transistors M1 and M4 in FIG. 3 are combined together as transistor M5 in FIG. 7. Similarly, transistors M3 and M6 in FIG. 3 are combined together as transistor M8 in FIG. 7. Transistor M19 in FIG. 7 is equivalent to transistor M2 in FIG. 3. Due to the specific gate voltage controller design shown in FIG. 7, transistors M5 in FIG. 3 is replaced by transistors M6 and M7 in FIG. 7. Transistors M15 and M16 connected in between M6 and M7 at node Z are used to ensure that no current flows through transistors M6 and M7 during the OFF state.

When switch 700 is turned ON by input signal S="1" (not shown in FIG. 7), then transistors M5, M19 and M8 form a circuit path between Vin and Vout that is turned on when the input voltage Vin is in the low range: 0<Vin<(Vdd−Vsg4) where Vsg4 is the source-to-gate voltage of transistor M4. For the input voltage range Vin<~(Vdd−Vsg4), PMOS transistor M4 is in the triode region of operation such that Vx is equal to Vdd. Node Y is floating between Vdd and 0V, since M14 (the source voltage of M14 is equal to Vx and hence, equal to Vdd, since transistor M13 is on) and M18 are off. The gate voltages of this first circuit path (transistors M5, M19 and M18) are all at Vdd. This circuit path is similar to the first circuit path 301 as discussed with regard to FIG. 3.

When switch 700 is turned ON and the input voltage Vin is in the middle range, ~Vdd−Vsg4<Vin<(2×Vdd)−Vsg4, then transistors M5, M6, M7 and M8 form a circuit path between Vin and Vout, similar to the second circuit path 302 discussed with regard to FIG. 3. Transistor M1 in FIG. 7 is biased as a current source set by a proper gate bias voltage Vswb. Transistors M1, M2 and M4 form a source follower, such that the voltage at node X will follow Vin with an offset voltage such that Vx=Vin+Vsg4, where Vx=voltage at node X. Node Y will follow node X such that Vx=Vy, since transistors M12, M13 and M14 are conducting for this input voltage range. Therefore, transistors M5, M6, M7 and M8 are turned on with their gate to source voltages equal to Vsg4. The on resistance for this Vin range is smaller if a small (W/L) is used for transistor M4, as this will maximize Vsg4. In the upper reaches of this Vin input voltage range, the branch M9, M10 and M11 is also turned on.

When switch 700 is turned ON and the input voltage Vin is in the high range 2×Vdd>Vin>|Vtp|+Vdd, (where Vtp is the typical threshold voltage for a PMOS transistor) then a circuit path from Vin to Vout is connected through transistors M9, M10 and M11. This circuit path is similar to the third circuit path 303 as discussed with regard to FIG. 3.

When switch 700 is turned OFF and the input voltage Vin is in the low range: 0<Vin<Vdd−Vtn, the gate voltages of transistors M5 and M8 are equal to Vdd (transistor M3 is on) and hence, transistors M5 and M8 are turned on. No conduction path is established between transistors M5 and M8 since M19 is off and nodes Y and Z are at 0V to keep transistors M6 and M7 off.

When switch 700 is turned OFF and the input voltage Vin is in the high range: Vdd+|Vtp|<Vin<2×Vdd, (where Vtp is the typical threshold voltage for a PMOS transistor), transistors M9 and M11 are on, but transistor M10 is turned off. Transistors M5 and M8 are also turned on in the middle input voltage range: Vdd−Vtn<Vin<2×Vdd. Transistors M5, M8, M9 and M11 during their periods of operation limit the voltage swings across the inner transistors M6, M7, M10 and M19, which are always off when switch 700 is off.

When switch 700 is in the OFF state, the gate voltages of M9 and M11 are at Vdd, forcing the source and drain voltages of M10 to be between Vdd+|Vtp9,11| and 2×Vdd, even though Vin and/or Vout may vary rail-to-rail between 0V and 2×Vdd. Hence, M9-M11 will not be under stress when switch 700 in the off state.

In all of these various operational configurations, the voltages across the different terminals of all the transistors are less than the breakdown voltage, whether switch 700 is on or off.

Although the preceding description describes various embodiments of the system, the invention is not limited to such embodiments, but rather covers all modifications, alternatives, and equivalents that fall within the spirit and scope of the invention. Since many embodiments of the invention can be made without departing from the spirit and scope of the invention, the invention resides in the claims hereinafter appended.

I claim:

1. A high voltage analog switch, implemented in a low voltage semiconductor process, comprising:
a first supply voltage (Vdd), a second supply voltage (2×Vdd), an input (Vin), an output and a binary signal line (S), wherein the high voltage analog switch in an off state decouples the input from the output responsive to a first binary state on the signal line S and the high voltage analog switch in an on state couples the input to the output responsive to a second binary state on the signal line S;
a plurality of circuit paths comprising:
a first circuit path comprising at least three series coupled MOSFET transistors (M1, M2, M3) having a first polarity coupled between the input and the output;
a second circuit path comprising at least three series coupled MOSFET transistors (M4, M5, M6) having a first polarity coupled between the input and the output; and
a third circuit path comprising at least three series coupled MOSFET transistors (M7, M8, M9) having a second polarity coupled between the input and the output;
wherein each of the first transistors (M1, M4, M7) and each of the third, transistors (M3, M6, M9) of the series coupled transistors is configured as a voltage limiting transistor; and
a switch controller configured to generate a plurality of gate control voltages, wherein each of the plurality of gate control voltages coupled to the gates of transistors M1, M3, M7 and M9 is equal to the first supply voltage; and each of the plurality of gate control voltages coupled to the gates of transistors M2, M4, M5, M6 and M8 is given by the following table:

| Input State S | Input Voltage Range (Vin) | Gate Voltages | | | |
|---|---|---|---|---|---|
| | | V1M (M2) | V2L (M4, M6) | V2M (M5) | V3M (M8) |
| ON | Low | Vdd | ~Vdd | ~Vdd | Vdd |
| | Middle | Vdd | Vin + Voffset | Vin + Voffset | Vdd |
| | High | Vdd | Vin + Voffset < 2 × Vdd | Vin + Voffset < 2 × Vdd | Vdd |
| OFF | Any | 0 | Vdd | 0 | 2 × Vdd | where Input Voltage (Vin) Ranges are:
Low, when 0 < Vin < Vdd − Vt
Middle, when Vdd − Vt < Vin < Vdd + Vt
High, when Vdd + Vt < Vin < 2 × Vdd; and
Vt = typical threshold voltage of transistors M1-M9 and Voffset > Vt.

2. The high voltage analog switch of claim 1, wherein the voltage across each one of the pluralities of transistors is limited to less than the breakdown voltage of each respective transistor of the pluralities of transistors.

3. The high voltage analog switch of claim 1, wherein the gate control voltage coupled to each of the transistors is either:
ground, the first supply voltage Vdd, the second supply voltage 2×Vdd, or
following the input voltage to the high voltage analog switch plus an offset voltage for turning on the transistor.

4. The high voltage analog switch of claim 1, wherein each of the second transistors (M2, M5, M8) of the series coupled transistors is configured as a switch.

5. The high voltage analog switch of claim 1, wherein each of the second transistors (M2, M5, M8) of the series coupled transistors is turned off when the high voltage analog switch is in the off state.

6. The high voltage analog switch of claim 1, wherein the breakdown voltage of each of the transistors is greater than the first supply voltage and less than the second supply voltage.

7. The high voltage analog switch of claim 1, wherein the input voltage and the output voltage is equal to or less than the second supply voltage.

8. The high voltage analog switch of claim 1, wherein the high voltage switch is a floating switch.

9. The high voltage analog switch of claim 1, wherein the switch controller comprises:

a voltage level controller coupled to the signal line S and having a first output (C) and a second output (Cb);

a first level shifter having an input coupled to C and generating a third output (U);

a second level shifter having an input coupled to Cb and generating a fourth output (Ub); wherein the outputs C, Cb, U and Ub as a function of the signal line S are given by the following table:

|  | Outputs | | | |
| --- | --- | --- | --- | --- |
| Binary Signal S | C | Cb | U | Ub |
| 0 (Switch = off) | Gnd | Vdd | Vdd | 2 × Vdd |
| 1 (Switch = on) | Vdd | Gnd | 2 × Vdd | Vdd | and a gate voltage controller coupled to the input, the first supply voltage Vdd, the second supply voltage 2×Vdd, and outputs C, Cb, U and Ub and generating the plurality of gate control voltages.

10. The high voltage analog switch of claim 1, wherein the plurality of gate control voltages are generated to control the on and off state of each transistor as a function of the signal line S and the voltage range at the input according to the following table:

| Input State | Input Voltage | First Circuit Path 301 | | | Second Circuit Path 302 | | | Third Circuit Path 303 | | |
| --- | --- | --- | --- | --- | --- | --- | --- | --- | --- | --- |
| S | Range | M1 | M2 | M3 | M4 | M5 | M6 | M7 | M8 | M9 |
| ON | Low | On | On | On | On | On | On | Off | Off | Off |
|  | Middle | Off | Off | Off | On | On | On | Off | Off | Off |
|  | High | Off | Off | Off | Off | Off | Off | On | On | On |
| OFF | Low | On | Off | On | On | Off | On | Off | Off | Off |
|  | Middle | Off | Off | Off | Off | Off | Off | Off | Off | Off |
|  | High | Off | Off | Off | Off | Off | Off | On | Off | On |

11. The high voltage analog switch of claim 10, wherein each of the plurality of circuit paths is selectively switched on responsive to a respective range of voltages at the input, when the high voltage analog switch is in the on state.

\* \* \* \* \*